United States Patent
Bonitz et al.

(10) Patent No.: US 7,094,966 B2
(45) Date of Patent: Aug. 22, 2006

(54) PACKAGING INTEGRATED CIRCUITS WITH ADHESIVE POSTS

(75) Inventors: Barry A. Bonitz, Endwell, NY (US); Eric A. Johnson, Greene, NY (US); Michael B. Vincent, Chenango Forks, NY (US)

(73) Assignee: International Business Machines Corporation, Armonk, NY (US)

( * ) Notice: Subject to any disclaimer, the term of this patent is extended or adjusted under 35 U.S.C. 154(b) by 653 days.

(21) Appl. No.: 10/278,687

(22) Filed: Oct. 22, 2002

(65) Prior Publication Data

US 2004/0075990 A1    Apr. 22, 2004

(51) Int. Cl.
*H01L 23/12*    (2006.01)
(52) U.S. Cl. ............... 174/52.4; 257/704; 257/713
(58) Field of Classification Search ............. 174/52.4; 257/704, 707, 713; 361/718, 719
See application file for complete search history.

(56) References Cited

U.S. PATENT DOCUMENTS

| | | | |
|---|---|---|---|
| 5,585,671 A * | 12/1996 | Nagesh et al. ............... 257/713 |
| 5,883,430 A | 3/1999 | Johnson |
| 5,909,057 A | 6/1999 | McCormick et al. |
| 6,002,171 A | 12/1999 | Desai et al. |
| 6,166,434 A | 12/2000 | Desai et al. |
| 6,229,702 B1 * | 5/2001 | Tao et al. ............... 174/52.4 |
| 6,297,960 B1 * | 10/2001 | Moden et al. ............... 257/724 |
| 6,333,460 B1 * | 12/2001 | Toy et al. ............... 174/52.4 |
| 6,469,381 B1 * | 10/2002 | Houle et al. ............... 257/704 |
| 6,515,360 B1 * | 2/2003 | Matsushima et al. ....... 257/704 |
| 6,667,557 B1 * | 12/2003 | Alcoe et al. ............... 257/778 |
| 2003/0030140 A1 * | 2/2003 | Shim ............... 257/713 |

OTHER PUBLICATIONS

EN886-0459, Jul. 1988.

* cited by examiner

*Primary Examiner*—Dean A. Reichard
*Assistant Examiner*—Adolfo Nino
(74) *Attorney, Agent, or Firm*—Schmeiser, Olsen & Watts; William H. Steinberg

(57) ABSTRACT

A package for an integrated circuit that is attached to a rigid substrate by the flip-chip method has a heat spreader that is attached to the IC by a thermally conductive, compliant adhesive and that is attached to the package substrate by a set of rigid posts of adhesive, the result of which is that the heat spreader is more closely parallel to the substrate than was the case for a stiffener bonded to the substrate by a thin film extending over a large area.

15 Claims, 1 Drawing Sheet

PACKAGING INTEGRATED CIRCUITS WITH ADHESIVE POSTS

TECHNICAL FIELD

The field of the invention is that of packaging an integrated circuit (IC), in particular of attaching a heat spreader to a flip-chip bonded IC and attaching the heat spreader to a rigid substrate with posts made of adhesive.

BACKGROUND OF THE INVENTION

In the field of packaging ICs, it is conventional to attach a "heat spreader" meaning a plate, with or without fins, to conduct heat generated during circuit operation away from the IC.

The effect of bonding a substrate and a chip with different coefficients of thermal expansion at elevated temperatures is that the organic substrates are warped, so that the finished module does not satisfy the flatness and/or coplanarity requirements that have been specified.

U.S. Pat. No. 6,166,434 illustrates a common approach, in which a chip is bonded to a rigid structure that makes thermal contact with the back side of the chip and is bonded to the substrate over the periphery of the structure. There is thus an extensive area over which stresses can be spread, which should alleviate warping.

A publication (EN886-0459, Research Disclosures July 1988) illustrates the use of a sheet of polyimide that flexes in response to stresses, so the IC is not in mechanical contact with a rigid substrate.

There still remains, however, a considerably problem of warping the substrate.

SUMMARY OF THE INVENTION

The invention relates to a packaging structure in which a heat spreader for an IC is attached to the substrate over a relatively small area.

A feature of the invention is the use of a set of posts attaching the heat spreader to the substrate that are made of a rigid adhesive.

Another feature of the invention is the use of a compliant thermal medium between the heat spreader and the IC.

DETAILED DESCRIPTION

Figure 1:
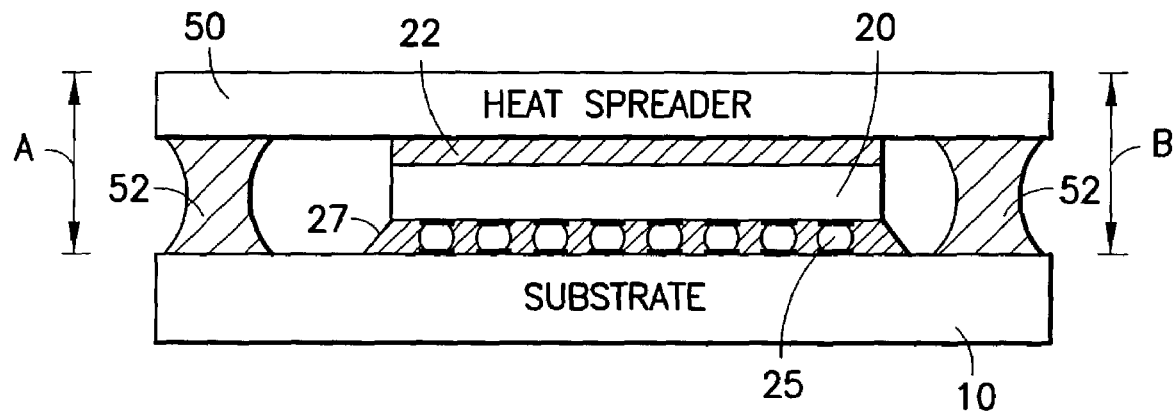
FIG. 1 shows a cross section of a portion of a package according to the invention.

FIG. 1 shows in cross section a simplified package according to the invention. Substrate 10, illustratively, an organic-based set of rigid layers containing laminated interconnects has a top surface with a set of contacts matching the contacts on the IC 20. Only one IC is shown, for convenience, but there could be any number that the designer chooses.

IC 20 is connected electrically and mechanically to the substrate by a set of "C4" solder balls 25, a standard method of connecting a chip to a substrate. Contacts 25 are enclosed by a conventional underfill material 27 that protects against fatigue induced failures of the "C4" solder balls 25, as well as shorting caused by various kinds of contamination.

Heat spreader 50, ill a thermally conductive insulator, is attached by a conventional thermally conductive, mechanically compliant material 22 to chip 20. The thermally conductive material may be an adhesive, but that is not important for the practice of the invention.

The problem addressed by this invention is that of improving the coplanarity of spreader 50 and substrate 10. It is well known in the art that organic-based substrates warp because of the difference in coefficient of thermal expansion between the chip and the substrate. Mechanical stresses pass between the rigid substrate and the rigid IC through the C4 contacts. In the past, various methods have been attempted to improve coplanarity, but the ones that work have been expensive. An example is that of the patent cited above. A shaped three-dimensional member that provides rigidity and thermal conductivity, together with a dimension appropriate for a particular chip, is rather expensive.

According to the invention, a set of adhesive posts 52 are formed by placing a dot of adhesive on the substrate and placing the spreader down to make contact with the thermal material 22 and with the dots of adhesive. It has been found that it does not matter whether the posts are or are not symmetrically placed about the boundary of the package. Both symmetric and non-symmetric layouts work well. The spreader is referred to as being "substantially flat", meaning that it does not have legs (or a rim or other structure) that project down past the top surface of the IC to contact the substrate. The spreader may or may not have fins on its top surface for heat dissipation.

It has been found unexpectedly that coplanarity (measured, for example, by the deviation of the top surface of the substrate from a plane), is substantially improved by this technique. The curvature may be positive or negative. One skilled in the art would have thought that making a bond between the spreader and the substrate at only a few isolated locations would inherently be susceptible to warping, compared with forming a bond uniformly around the periphery of the chip.

Further, it has been found that there is essentially no difference between an embodiment of the invention using four adhesive posts and one using eight posts.

The sequence of operation may be summarized as:

Provide a packaging substrate with contacts on the top surface.

Put down the IC and reflow the solder to bond and connect electrically the chip to the substrate.

Flow an underfill material around the C4 connections.

Coat the top of the chip with the thermally conductive material and put down dabs of epoxy adhesive.

Place the heat spreader in position and press down so that the spreader contacts the thermal material and the adhesive posts.

Cure the adhesives.

Preferably, the epoxy is a conventional thermosetting material that cures at a temperature of about 150° C. Also preferably, the thermal material is a conventional filled silicon material formulated for high thermal conductivity, such as GE3281. It does not have to have high bond strength. It is preferable that the thermal material be flexible and compliant. The fill material 27 around the C4 contacts is illustratively Namics U8437-2.

An option that might be used is the use of a mechanical fixture to hold the spreader in place while it cures. Unexpectedly, it has been found that there is no need for such a fixture. Simply pressing the spreader down with a slight force sufficient to ensure contact has been found to provide substantially improved coplanarity compared with the prior art.

Figure 2A:
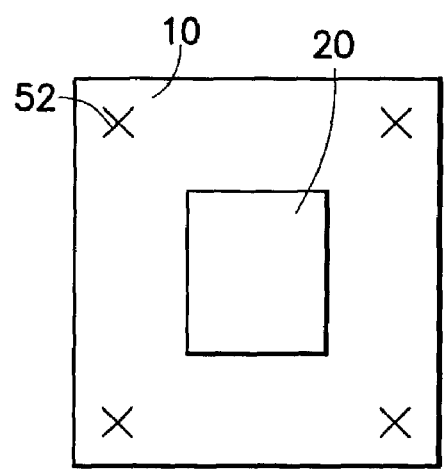
FIGS. 2A and 2B show plan views of embodiments of the invention.
Figure 2B:
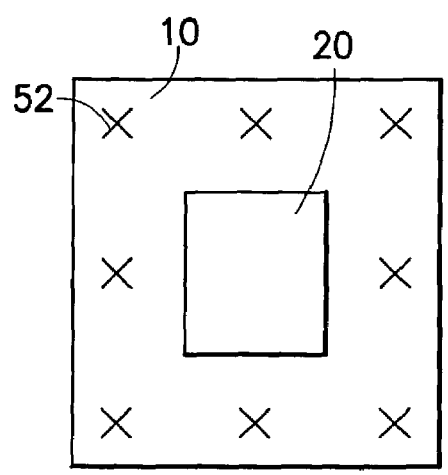

Referring now to FIG. 2, there is shown a plan view of two embodiments of the invention. In FIG. 2A, substrate 10 has a place for an IC, shown schematically as box 20. Near the corners of the substrate, located at a distance of greater than ½ the dimension of chip 20, four adhesive posts denoted with X's 52 bond the spreader to the substrate. In the alternative embodiment, shown in FIG. 2B, there are an additional four posts located at the mid-points of the sides. Unexpectedly, experiments have shown that there is no substantial difference between these two embodiments. One skilled in the art would have expected that doubling the number of attachment points would have made a substantial difference. Experimental results for a diameter of 15 mils for the adhesive posts and a thickness of both 1.5 mils and 3 mils, in a substrate 42 mils across showed that the coplanarity of the embodiment of FIG. 2B differed by only 10% from that of FIG. 2A, while the average of the two embodiments was 62% of a reference approach.

While the invention has been described in terms of a single preferred embodiment, those skilled in the art will recognize that the invention can be practiced in various versions within the spirit and scope of the following claims.

What is claimed is:

1. A package comprising:
   a substrate;
   an integrated circuit (IC) attached to said substrate by a set of conductive pads; and
   a heat spreader attached to said IC by a thermally conductive material and attached to said substrate by a set of posts of rigid adhesive,
   wherein the package does not comprise a stiffener bonded to the substrate.

2. The package of claim 1, wherein the set of posts are distributed non-symmetrically on a peripheral boundary of the substrate.

3. The package of claim 1, wherein the set of posts are distributed symmetrically on a peripheral boundary of the substrate.

4. The package of claim 3, wherein the set of posts consists of four posts located in four corners of the substrate.

5. The package of claim 3, wherein the set of posts consists of eight posts located in four corners of the substrate and at the centers of four sides of the substrate.

6. The package of claim 1, wherein each post of the set of posts has a diameter of 15 mils.

7. The package of claim 1, wherein each post of the set of posts has a thickness of 1.5 mils or 3 mils.

8. A package for an integrated circuit, comprising:
   a substrate;
   an integrated circuit (IC) attached to said substrate by a set of conductive pads; and
   a heat spreader attached to said IC by a thermally conductive material and attached to said substrate by a set of posts of rigid adhesive, wherein said set of posts are located in four corners of said package and at the centers of sides of said IC.

9. A method of packaging an IC comprising the steps of:
   providing a substrate;
   connecting electrical contacts on said IC to corresponding contacts on said substrate;
   providing a substantially planar heat spreader;
   thermally connecting said heat spreader to a side of said IC opposite said electrical contacts with a thermally conductive material; and
   attaching said heat spreader to said substrate with a set of adhesive posts,
   wherein the method does not comprise bonding a stiffener to the substrate.

10. The method of claim 9, wherein the set of adhesive posts are distributed non-symmetrically on a peripheral boundary of the substrate.

11. The method of claim 9, wherein the set of adhesive posts are distributed symmetrically on a peripheral boundary of the substrate.

12. The method of claim 11, wherein the set of adhesive posts consists of four adhesive posts located in four corners of the substrate.

13. The method of claim 11, wherein the set of adhesive posts consists of eight adhesive posts located in four corners of the substrate and at the centers of four sides of the substrate.

14. The method of claim 9, wherein each adhesive post of the set of adhesive posts has a diameter of 15 mils.

15. The method of claim 9, wherein each adhesive post of the set of adhesive posts has a thickness of 1.5 mils or 3 mils.

* * * * *